Jan. 26, 1971 K. K. N. CHANG ET AL 3,559,097
HIGH POWER, HIGH EFFICIENCY SILICON AVALANCHE DIODE UHF AND L BAND OSCILLATOR
Filed Feb. 5, 1969
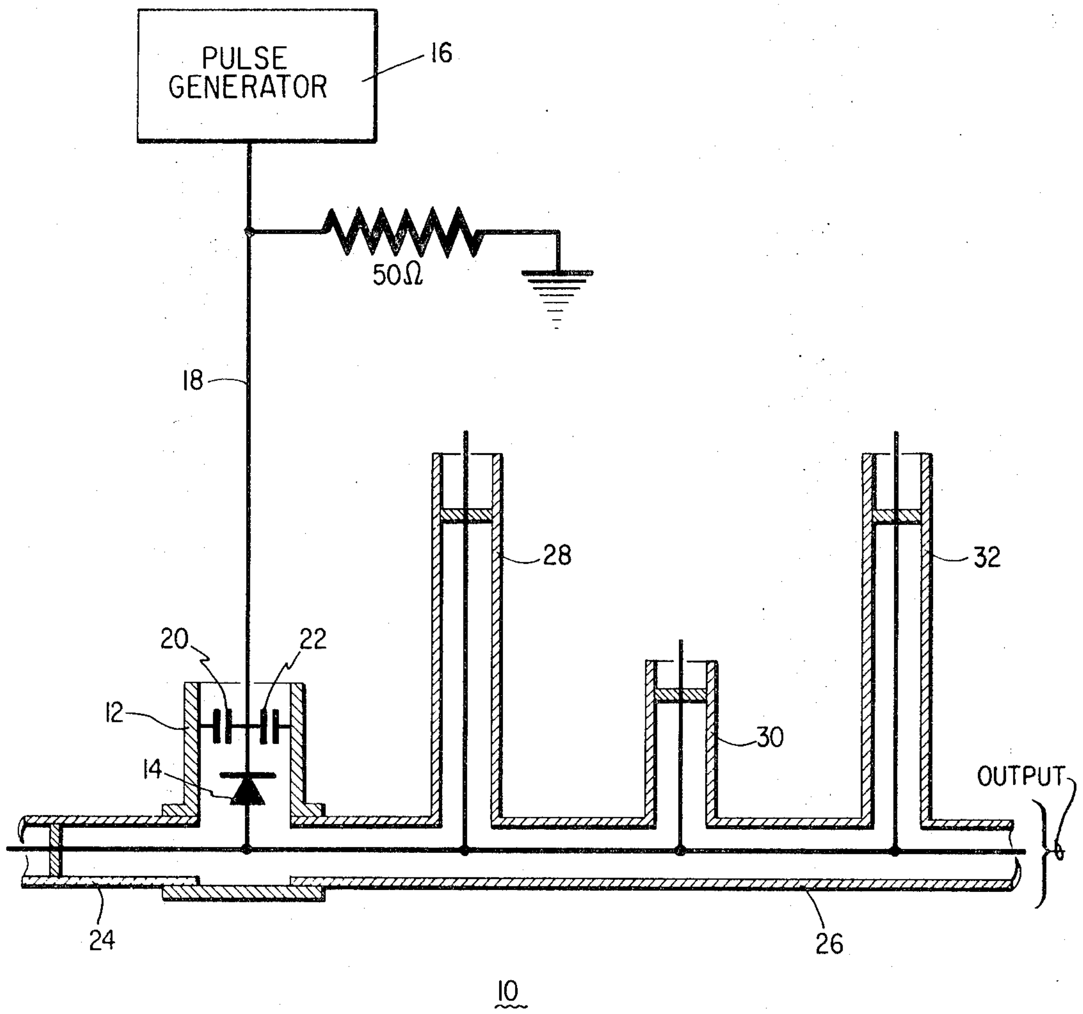
INVENTORS.
Kern K. N. Chang,
Hans J. Prager,
and Sherman Weisbrod.
BY George J. Seligsohn
ATTORNEY United States Patent Office 3,559,097

Patented Jan. 26, 1971

3,559,097
HIGH POWER, HIGH EFFICIENCY SILICON AVALANCHE DIODE UHF AND L BAND OSCILLATOR

Kern K. N. Chang, Princeton, Hans J. Prager, Belle Mead, and Sherman Weisbrod, Trenton, N.J., assignors to RCA Corporation, a corporation of Delaware Filed Feb. 5, 1969, Ser. No. 796,846
Int. Cl. H03b *7/06*
U.S. Cl. 331—107 3 Claims

ABSTRACT OF THE DISCLOSURE

An improved silicon avalanche diode oscillator for pulsed operation in the UHF or L band, which has an efficiency (40 percent or better) at least equal to that of vacuum tube oscillators operating at these frequencies, is obtained by utilizing at least three spaced sliding short stub tuners as part of a coaxial structure in which is situated the diode.

This invention relates to pulsed high power silicon avalanche diode oscillators for operation in the UHF or L band and, more particularly, to such oscillators having an efficiency of operation significantly higher than that heretofore obtainable.

Since the advent of solid state diodes and transistors, it has been desirable wherever possible to substitute such solid state devices for vacuum tubes so as to obtain the inherent advantages of solid state devices over vacuum tubes, such as small size, ruggedness and long life. However, in order that it be practical to substitute a solid state device for a vacuum tube in any given application, it is necessary that the solid state device be capable of performing the same functions as the vacuum tube at an efficiency which is at least comparable to that of the vacuum tube.

A UHF or L band pulsed vacuum tube oscillator producing output power in the order of tens or hundreds of watts can be operated at an overall efficiency in the order of 40 percent or so. Prior to the present invention, solid state oscillators operating at this frequency and power range had a maximum efficiency of only 25 percent or so, as is disclosed in the article "High Power, High Efficiency Silicon Avalanche Diodes at Ultrahigh Frequencies," written by us, which appears on pages 586 and 587 of the April 1967 issue of Proceedings of the IEEE. The material disclosed in this article is incorporated herein by reference.

Briefly, the oscillator disclosed in the said article comprises a coaxial structure including a cavity portion in which is situated a silicon avalanche diode. A first sliding short tuner is coupled to one side of the cavity portion and a length of coaxial member couples the other side of the cavity portion to an output adapted to have an external load coupled thereto. In the oscillator disclosed in the article only two spaced sliding short stub tuners are respectively coupled to the coaxial member at separate predetermined positions along the length thereof. The frequency of oscillation, the power output and the efficiency depend upon the tuning of the first tuner and each of the two stub tuners. Operating under pulsed conditions with a duty factor of approximately $10^{-3}$, efficiencies as high as 25 percent, and power outputs up to 435 watts at 425 megahertz, were achieved by the oscillator disclosed in the aforesaid article. This 25 percent efficiency does not compare favorably with the 40 percent or so overall efficiency of a vacuum tube oscillator operating at such power and frequency.

In accordance with the present invention, it has been found that by modifying the structure disclosed in the aforesaid article to provide at least three, rather than only two, spaced sliding short stub tuners respectively coupled to the coaxial member at separate predetermined positions along the length thereof, the first tuner and each of the stub tuners may be tuned to provide operation of the oscillator at a given fundamental frequency in the UHF or L band in response to an energization pulse being applied to the cavity portion so as to present an impedance to the diode which is relatively low and relatively resistive solely at the fundamental frequency and which is relatively high and relatively reactive at each of the harmonics of the fundamental frequency. In addition, the coaxial member together with the tuned stub tuners acts as a low pass filter between the diode and the output for passing substantially only the fundamental frequency to the output. By means of this structure, there were obtained efficiencies of 40 percent or more, with a maximum of 60 percent, depending upon the particular frequency of operation in the UHF or L band. Therefore, a solid state, high power oscillator for L band or ultra high frequencies which is competitive in efficiency with vacuum tube oscillators at these frequencies has been achieved.

It is therefore an object of the present invention to provide a high power L band or UHF avalanche diode oscillator of improved efficiency.

This and other objects, features and advantages of the present invention will become more apparent from the following detailed description taken together with the accompanying drawing in which:

The sole figure is a schematic diagram of a preferred embodiment of the invention.

Referring to the figure, a coaxial structure 10 includes a cavity portion 12 having situated therein, as shown, avalanche diode 14. Pulse generator 16, having an output impedance of 50 ohms, supplies energization pulses of about one microsecond duration at about a one percent duty cycle to avalanche diode 14 over connection 18. Incorporated within cavity portion 12 are capacitive elements 20 and 22 connected to connection 18, as shown.

The coaxial structure 10 further includes first sliding short tuner 24 connected to the left side of cavity portion 12. The output of coaxial structure 10, to which is coupled an external load (not shown), is connected to the right side of cavity portion 12 by a length of coaxial member 26. Spaced along the length of coaxial member 26 are three sliding short stub tuners 28, 30 and 32, respectively, coupled to coaxial member 26 at separate predetermined positions along the length thereof.

The only substantial difference between the structure shown in the drawing and the structure disclosed in our aforesaid article is that coaxial member 26 has three sliding short stub tuners coupled thereto, while the corresponding coaxial member of the device disclosed in the article has only two sliding short stub tuners coupled thereto. However, this structural difference is immensely important in increasing the efficiency of operation of the avalanche diode oscillator at L band or ultrahigh frequencies.

More particularly, the use of at least three stub tuners, rather than only two stub tuners permits the diode to have presented thereto a relatively low, relatively resistive impedance solely at the fundamental frequency to which the oscillator is tuned in a relatively high, relatively reactive impedance at each of the harmonics of the fundamental frequency. In addition, it permits the structure consisting of coaxial member 26 together with at least three stub tuners, such as stub tuners 28, 30 and 32, to operate as a low pass filter between the diode and the output for passing substantially only the fundamental frequency to the output, while confining the generated harmonic oscillation frequencies to the internal operation of the oscillator.

By way of example, it was found that when first tuner 24 was a 50 centimeter stub with the sliding short set at 39.3; stub tuner 28 was a 50 centimeter stub spaced 7.5 centimeters from diode 14 and having its sliding short set at 33.2; stub tuner 30 was a 20 centimeter stub spaced 16.7 centimeters from stub tuner 28 and having its sliding short set at 16.6; and stub tuner 32 was a 50 centimeter stub spaced 7.1 centimeters from stub tuner 30 and 6.2 centimeters from the output and having its sliding short set at 37.5, the avalanche diode oscillator operated at about 50 percent efficiency to provide oscillations at 65 watts peak pulse power at a fundamental RF frequency of 605 megahertz, and the impedance presented to the diode at the fundamental frequency and at each of several harmonics was as follows:

| | |
|---|---|
| $f_1$=605 mHz. | $Z_1$=(0.9+j 1.0) ohms |
| $f_2$=1210 mHz. | $Z_2$=(1.5−j 17) ohms |
| $f_3$=1815 mHz. | $Z_3$=(35+j 80) ohms |
| $f_4$=2420 mHz. | $Z_4$=(0+j 87) ohms |
| $f_5$=3025 mHz. | $Z_5$=(21+j 83) ohms |

Athough the preferred embodiment comprises a coaxial structure, it should be understood that other types of L-band transmission line, such as microstrip for instance, may be substituted therefor.

What is claimed is:

1. In a high power, high efficiency silicon avalanche diode oscillator for operation in the UHF band comprising an L-band transmission line structure including a cavity portion in which is situated said diode, a first sliding short tuner coupled to one side of said cavity portion and a length of transmission line for coupling the other side of said cavity portion to an output adapted to have an external load coupled thereto; the improvement comprising therewith at least three spaced sliding short stub tuners respectively coupled to said length of transmission line at separate predetermined positions along the length thereof, said first tuner and each of said stub tuners being tuned to provide operation of said oscillator at a given fundamental frequency in the UHF or L band in response to an energization pulse being applied to said cavity portion and to present to said diode a relatively low relatively resistive impedance solely at said fundamental frequency and a relatively high relatively reactive impedance at each of the harmonics of said fundamental frequency and to further operate as a low pass filter between said diode and said output for passing substantially only the fundamental frequency to said output, whereby the efficiency of said oscillator is increased.

2. The oscillator defined in claim 1, wherein the number of said stub tuners is equal to three.

3. The oscillator defined in claim 1, wherein said L-band transmission line structure is a coaxial structure.

References Cited

Prager et al.: Proc. IEEE, pp. 586–587, April 1967.

JOHN KOMINSKI, Primary Examiner

U.S. Cl. X.R.

321—69; 331—101; 333—31, 33